US009306730B1

(12) United States Patent
Shu et al.

(10) Patent No.: US 9,306,730 B1
(45) Date of Patent: Apr. 5, 2016

(54) FRACTIONAL-N PLL-BASED CDR WITH A LOW-FREQUENCY REFERENCE

(71) Applicant: Xilinx, Inc., San Jose, CA (US)

(72) Inventors: Guanghua Shu, Champaign, IL (US);
Mohamed N. Elzeftawi, Santa Clara, CA (US); Ahmed M. Elkholy, Champaign, IL (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/613,652

(22) Filed: Feb. 4, 2015

(51) Int. Cl.
| | |
|---|---|
| H03D 3/24 | (2006.01) |
| H04L 7/00 | (2006.01) |
| H04L 7/033 | (2006.01) |
| H04L 7/04 | (2006.01) |
| H03L 7/197 | (2006.01) |

(52) U.S. Cl.
CPC ............ *H04L 7/0037* (2013.01); *H03L 7/1974* (2013.01); *H04L 7/0331* (2013.01); *H04L 7/0332* (2013.01); *H04L 7/041* (2013.01)

(58) Field of Classification Search
CPC ..... H04L 7/033; H04L 7/0331; H04L 7/0037; H04L 2027/0036; H04L 7/00; H04L 7/06; H04L 7/08; H04L 7/0807; H04L 7/085; H04L 7/087; H04L 7/0895; H04L 7/093; H04L 7/0996; H04L 7/1075; H04L 7/16
USPC .......................... 375/375, 374, 327, 366, 376
See application file for complete search history.

(56) References Cited

U.S. PATENT DOCUMENTS

| | | | | |
|---|---|---|---|---|
| 8,120,407 | B1 * | 2/2012 | Ooi et al. ....................... | 327/241 |
| 8,803,583 | B2 * | 8/2014 | Nedachi ......................... | 327/296 |
| 2005/0030073 | A1 * | 2/2005 | Wakayama et al. ........... | 327/156 |
| 2009/0074123 | A1 * | 3/2009 | Hsueh et al. ................... | 375/360 |
| 2012/0201289 | A1 * | 8/2012 | Abdalla et al. ................ | 375/233 |

OTHER PUBLICATIONS

Chan, Steven C., "A Resonant Global Clock Distribution for the Cell Broadband Engine Processor " *IEEE Journal of Solid-State Circuits*, Jan. 2009, pp. 64-72, vol. 45, No. 12, IEEE, Piscataway, New Jersey, USA.

Fukuda, Koji et al., "A 12.3-mW 12.5-Gb/s Complete Transceiver in 65-nm CMOS Process " *IEEE Journal of Solid-State Circuits*, Dec. 2010, pp. 2838-2849, vol. 45, No. 12, IEEE, Piscataway, New Jersey, USA.

Hossain, Masum et al., "A 4x40 Gb/s Quad-Lane CDR with Shared Frequency Tracking and Data Dependent Jitter Filtering," *2014 Symposium on VLSI Circuits Digest of Technical Papers*, Jun. 10, 2014, pp. 1-2, IEEE, Piscataway, New Jersey, USA.

Shu, Guanghua et al., "A 4-to-10.5Gb/s 2.2mW/Gb/s Continuous-Rate Digital CDR with Automatic Frequency Acquisition in 65nm CMOS," *2014 IEEE International Solid-State Circuits Conference*, Feb. 9, 2014, pp. 150-151, IEEE, Piscataway, New Jersey, USA.

Tasca, Davide et al., "A 2.9-to-4.0GHz Fractional-N Digital PLL with Bang-Bang Phase Detector and 560fs$_{rms}$ Integrated Jitter at 4.5mW Power," *2011 IEEE International Solid-State Circuits Conference*, IEEE, Piscataway, New Jersey, USA.

* cited by examiner

*Primary Examiner* — Qutbuddin Ghulamali
(74) *Attorney, Agent, or Firm* — W. Eric Webostad; Robert M. Brush (57) ABSTRACT

An apparatus relates generally to clock and data recovery. A fractional-N phase-locked loop is for receiving a reference signal, and for providing a proportional signal and an integral signal. A ring oscillator of the fractional-N phase-locked loop is for receiving the proportional signal and the integral signal, and for providing an oscillation signal at a clock frequency substantially greater than a reference frequency of the reference signal. A data-to-frequency control word converter is for receiving data input and the oscillation signal, and for providing a frequency control word. A fractional-N divider of the fractional-N phase-locked loop is for receiving the frequency control word and the oscillation signal, and for providing a feedback clock signal to a phase-frequency detector of the fractional-N phase-locked loop. The phase-frequency detector is for receiving the reference signal and the feedback clock signal, and for adjusting a phase and frequency of the oscillation signal.

20 Claims, 8 Drawing Sheets

FRACTIONAL-N PLL-BASED CDR WITH A LOW-FREQUENCY REFERENCE

TECHNICAL FIELD

The following description relates to integrated circuit devices ("ICs"). More particularly, the following description relates to fractional-N phase-locked loop-based ("FNPLL-based") clock and data recovery ("CDR") with a low-frequency reference for an IC.

BACKGROUND

Data rates are increasing, in part due to increasing demand for communication bandwidth. Advanced technologies may provide high-speed data rates; however, power consumption for such high-speed signals can be significant. For example, clock distribution power in high-speed serial link systems may be considerable as clocking frequency increases to support high data rates. Conventionally, a clock signal may be sourced from a common clock source. This common clock source may be distributed or routed over a long distance across an IC. Routing a high frequency clock signal over a significant distance can consume a significant amount of power. This power consumption has become an increasingly significant issue with increased frequencies to support high data rate systems.

Additionally, serial link systems may support multiple communication specifications ("multi-standard serial link systems") with a single crystal oscillator. More recently, integer-N phase-locked loops ("PLLs") may be dedicated to provide clock frequencies used by various communication specifications in such multi-standard serial link systems. However, use of integer-N PLLs may involve having different crystal oscillators for PLL reference clock signal inputs, for supporting different frequencies of different communication specifications. Furthermore, having discrete frequency ranges, as in a conventional integer-N PLL multi-standard serial link system, may limit flexibility with respect to having a discontinuous data rate range covered by such frequency ranges.

While LC-tank oscillators are known to have low phase noise, such LC-tank oscillators conventionally consume large amounts of semiconductor area, and their tuning range may be limited by their quality factor. On the other hand, ring voltage controlled oscillators can provide a wide frequency range, but their phase noise performance may not be adequate for high performance applications.

Accordingly, it would be desirable and useful to provide a clock generator for a receiver that overcomes or mitigates one or more of the above-described limitations.

SUMMARY

An apparatus relates generally to clock and data recovery. In such an apparatus, a fractional-N phase-locked loop is for receiving a reference signal, and for providing a proportional signal and an integral signal. A ring oscillator of the fractional-N phase-locked loop is for receiving the proportional signal and the integral signal, and for providing an oscillation signal at a clock frequency substantially greater than a reference frequency of the reference signal. A data-to-frequency control word converter is for receiving data input and the oscillation signal, and for providing a frequency control word. A fractional-N divider of the fractional-N phase-locked loop is for receiving the frequency control word and the oscillation signal, and for providing a feedback clock signal to a phase-frequency detector of the fractional-N phase-locked loop. The phase-frequency detector of the fractional-N phase-locked loop is for receiving the reference signal and the feedback clock signal, and for adjusting a phase and frequency of the oscillation signal.

A serial link system relates generally to supporting multiple frequencies via multiple lanes. In such a serial link system, a reference oscillator is for providing a reference signal, and there are a plurality of clock and data recovery blocks corresponding to the multiple lanes. The plurality of clock and data recovery blocks are commonly coupled for receiving the reference signal. Each of the plurality of clock and data recovery blocks includes a fractional-N phase-locked loop and a data-to-frequency control word converter. The fractional-N phase-locked loop has a ring oscillator for providing an oscillation signal at a clock frequency substantially greater than a reference frequency of the reference signal. The data-to-frequency control word converter is for receiving a data input for a corresponding lane of the multiple lanes, receiving the oscillation signal, and for providing a frequency control word to the fractional-N phase-locked loop.

A method relates generally to clock and data recovery. In such a method, a reference signal is received by a fractional-N phase-locked loop. A proportional signal and an integral signal are generated by the fractional-N phase-locked loop. The proportional signal and the integral signal are received by a ring oscillator of the fractional-N phase-locked loop. An oscillation signal is output by the ring oscillator at a clock frequency substantially greater than a reference frequency of the reference signal. A data input and the oscillation signal are received by a data-to-frequency control word converter. A frequency control word is provided by the data-to-frequency control word converter. The frequency control word and the oscillation signal are received by a fractional-N divider of the fractional-N phase-locked loop. The oscillation signal is divided by the fractional-N divider to output a feedback clock signal. The feedback clock signal is fed back to a phase-frequency detector of the fractional-N phase-locked loop. The reference signal and the feedback clock signal are received by the phase-frequency detector of the fractional-N phase-locked loop. An up signal and a down signal are provided from the phase-frequency detector. The phase and frequency of the oscillation signal are adjusted responsive to the up signal and the down signal.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided for further understanding.

Heretofore, supporting high-speed serial links capable of having different frequencies meant supplying a high-speed clock frequency, conventionally from a crystal oscillator or a common on-chip clock source, to clock and data recovery blocks. Unfortunately, this meant routing such a high-speed clock frequency for significant distances over an integrated circuit die, which consumed a significant amount of power.

Described below in additional details are clock and data recovery blocks having local oscillators for receiving a common low-speed reference frequency for separately generating high-speed clock frequency signals. To accommodate a wide bandwidth for supporting any of a variety of frequencies, fractional-N phase-locked loops are used in such clock and data recovery blocks. Other details regarding such clock and data recovery blocks are described below.

Prior to a detailed description of clock and data recovery blocks with local oscillators, a more detailed description regarding a transceiver bank is provided to enhance understanding.

Figure 1:
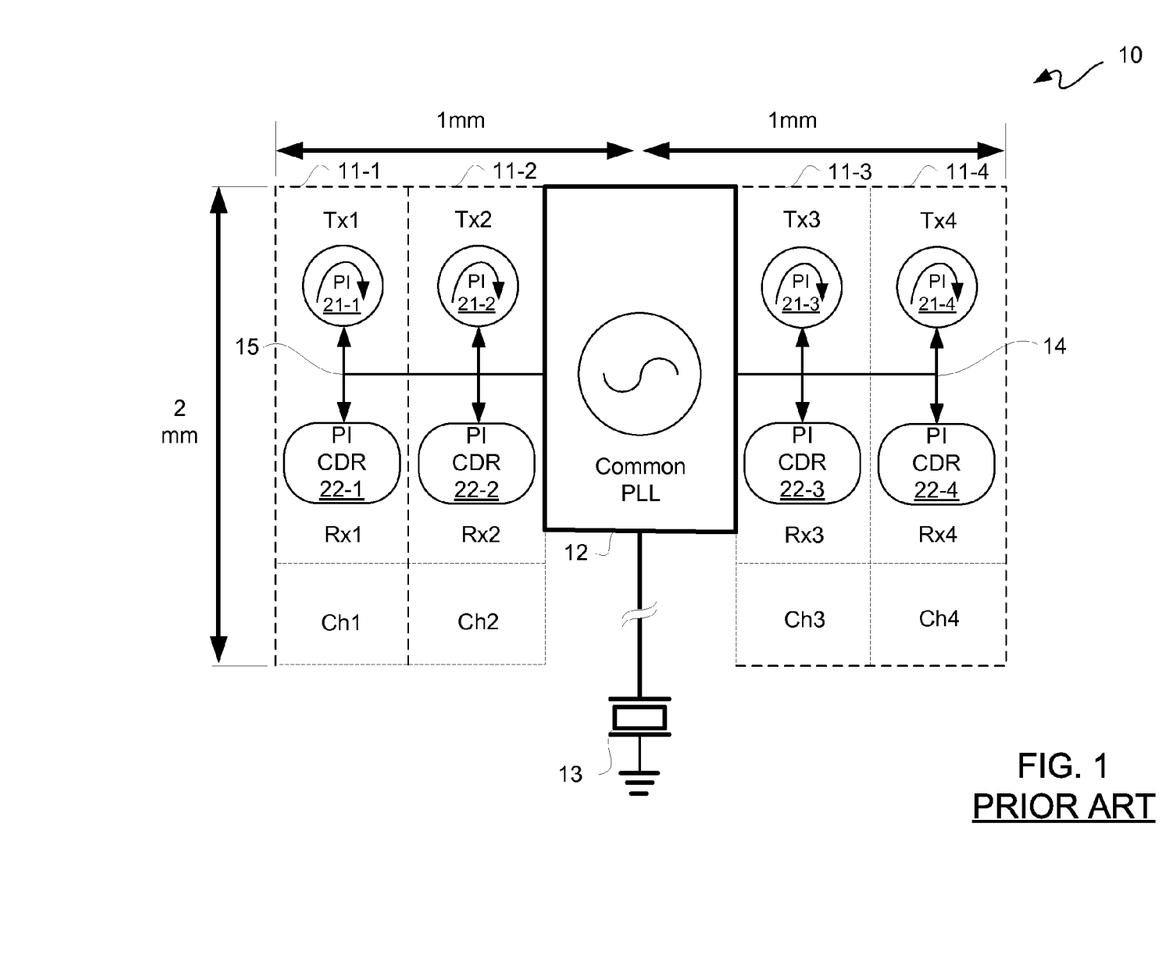
FIG. 1 is a block diagram depicting an exemplary conventional transceiver bank.

FIG. 1 is a block diagram depicting an exemplary transceiver bank 10. Transceiver bank 10 may be in an IC, such as an FPGA or other IC. In this example, transceiver bank 10 includes four transceivers 11, a common phase-locked loop ("PLL") 12 as a common clock source, and a single common oscillator 13 as a reference source for PLL 12.

Even though four transceivers 11 are illustratively depicted, fewer or more than four transceivers 11 may be used in other implementations. Oscillator 13 may be internal or external with respect to an IC hosting transceiver bank 10, such as a single external crystal oscillator 13 in this example. In this example, it is assumed that PLL 12 operates to provide at least approximately an 8 GHz clock signal or higher.

Oscillator 13 is coupled to PLL 12 to provide a reference signal to PLL 12, and PLL 12 using such reference signal sources at least one clock signal, which may be provided to a right-side clock distribution network 14 and a left-side clock distribution network 15 with respect to PLL 12 being generally centered with respect to clock networks 14 and 15.

In this example, a first transceiver 11-1 includes a transmitter ("Tx1") and a receiver ("Rx1") respectively, having a Tx phase interpolator ("PI") block 21-1 and an Rx PI and clock and data recovery ("CDR") block 22-1; a second transceiver 11-2 includes a transmitter ("Tx2") and a receiver ("Rx2") respectively having a Tx PI block 21-2 and an Rx PI and CDR block 22-2; a third transceiver 11-3 includes a transmitter ("Tx3") and a receiver ("Rx3") respectively having a Tx PI block 21-3 and an Rx PI and CDR block 22-3; and a fourth transceiver 11-4 includes a transmitter ("Tx4") and a receiver ("Rx4") respectively having a Tx PI block 21-4 and an Rx PI and CDR block 22-4.

Blocks 21-1, 21-2, 22-1, and 22-2 may be commonly coupled to left-side clock network 15 for receiving a clock signal sourced from PLL 12, and blocks 21-3, 21-4, 22-3, and 22-4 may be commonly coupled to right-side clock network 14 for receiving a same or different clock signal sourced from PLL 12 than that provided to left-side clock network 15. In this example, transceivers 11-1 through 11-4 are respectively for channels Ch1, Ch2, Ch3, and Ch4.

For purposes of clarity by way of example and not limitation, it shall be assumed transceiver bank 10 has an overall width of approximately 2 mm and an overall height of approximately 2 mm; however, these or other dimensions may be used in other implementations. Accordingly, providing a high frequency signal over a significant routing distance, such as via clock networks 14 and 15 in this example, may consume a significant amount of power for routing and buffering/driving one or more clock signals ("clock distribution power"). Also, with respect to power consumption of a transceiver 11, an Rx PI CDR block 22 may consume a significant amount of power, as compared for example with a Tx PI block 21. Therefore, providing a low-power Rx PI CDR block may be useful. Furthermore, it may be useful if such a low-power Rx PI CDR block supported a wide frequency range.

Figure 2:
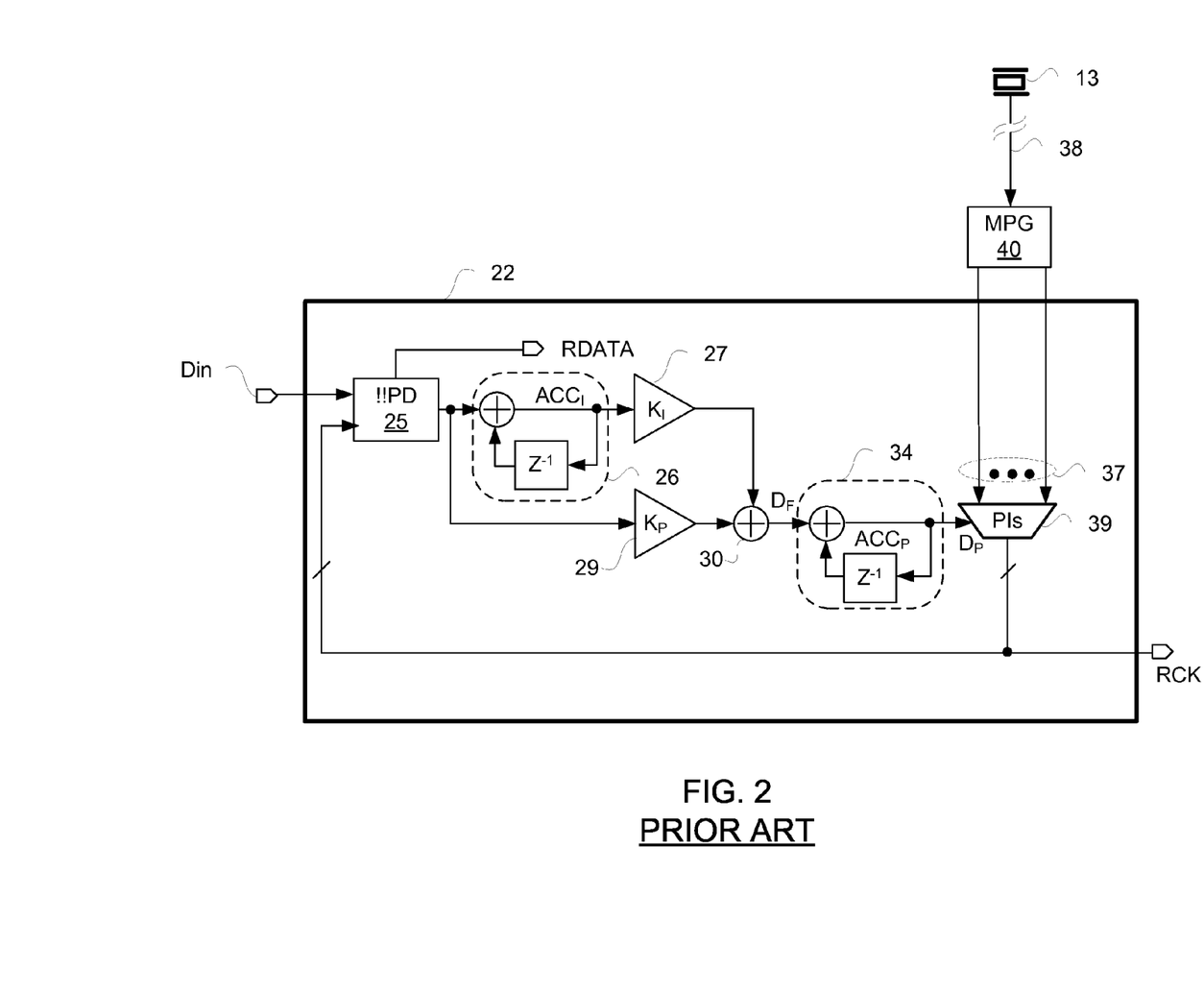
FIG. 2 is a schematic diagram depicting an exemplary conventional PI-based clock and data recovery ("CDR") block, which may be used in the transceiver bank of FIG. 1.

Clock distribution power may further be consumed by a conventional PI-based CDR block 22, as illustratively depicted in the schematic diagram of FIG. 2. This is an example of a conventional PI-based digital sub-rate CDR block 22. PI-based digital sub-rate CDR block 22 may include a bang-bang phase detector ("!!PD") 25, an accumulator ("ACC") 26, a buffer 27, a buffer 29, an adder 30, an accumulator 34, and a plurality of phase interpolators ("PIs") 39. As conventional PI-based digital sub-rate CDR block 22 is conventional, it is not described in unnecessary detail for purposes of clarity.

A multi-phase generator ("MPG") 40 of a common PLL 12 may be coupled to receive a reference clock signal 38 from oscillator 13. MPG 40 may use I/Q clock phases for interpolation to generate multiple reference clock signals 37 with multiple phases for a sub-rate receiver, namely a sub-sampling rate receiver. These clock phases of clock signals 37 may be routed a long distance before getting to PIs 39. Conventionally, in order to achieve a high-quality clock signal and good, equally-spaced phases in sub-rate systems, clock distribution power increases rapidly as clock frequency goes higher than approximately 5 GHz. Thus, reducing clock distribution power may be desirable and useful.

Digital CDR is emerging as a substitute to their analog counterparts due to area efficiency and portability to advanced technology. Accordingly, a charge pump and loop filter in an analog CDR block may be replaced by digital logic, as illustratively depicted in the conventional PI-based digital sub-rate CDR block 22 of FIG. 2.

However, in order to make digital logic synthesizable for providing a high-frequency clock signal, such digital logic conventionally may be clocked at a significantly lower rate compared to a high-speed data rate. Generally, this translates to a slow phase update rate in PI-based digital sub-rate CDR block 22.

A slow update rate may introduce large latency, which may severely degrade phase margin ("PM") of a CDR loop of PI-based digital sub-rate CDR block 22, and may cause peaking in a jitter transfer function of PI-based digital sub-rate CDR block 22. A CDR open loop gain of PI-based digital sub-rate CDR block 22 may be sufficiently reduced to provide enough PM, but this reduces operable bandwidth of such PI-based digital sub-rate CDR block 22.

Furthermore, due to a slow phase update rate, a large phase step size may be used to track an equivalent amount of frequency offset, which potentially increases contribution of quantization error in overall jitter. Therefore, reducing, including minimizing, CDR loop latency may be desirable and useful to provide a high CDR bandwidth for better jitter tolerance.

Recently, fractional-N PLLs have been proposed. For wide range operation, fractional-N PLLs can generate a clock with continuous frequency range and fine frequency resolution with a single crystal. However, use of fractional-N PLLs in multi-standard systems with one or more serial links ("serial link systems") may still be burdened by driving one or more high frequency clock signals a long-distance consuming significant clock distribution power. Accordingly, reducing distance of high-frequency clock distribution to reduce clock distribution power may be desirable and useful.

To provide one or more of reduced clock distribution power, a high CDR bandwidth for digital CDR, a compact semiconductor area in comparison to an LC-tank oscillator, and/or sufficiently low phase noise for a high-speed multi-standard serial link system with sufficient phase margin, a fractional-N PLL-based CDR as described below may be used.

With the above general understanding borne in mind, various configurations for serial link systems and clock and data recovery blocks are generally described below.

Figure 3:
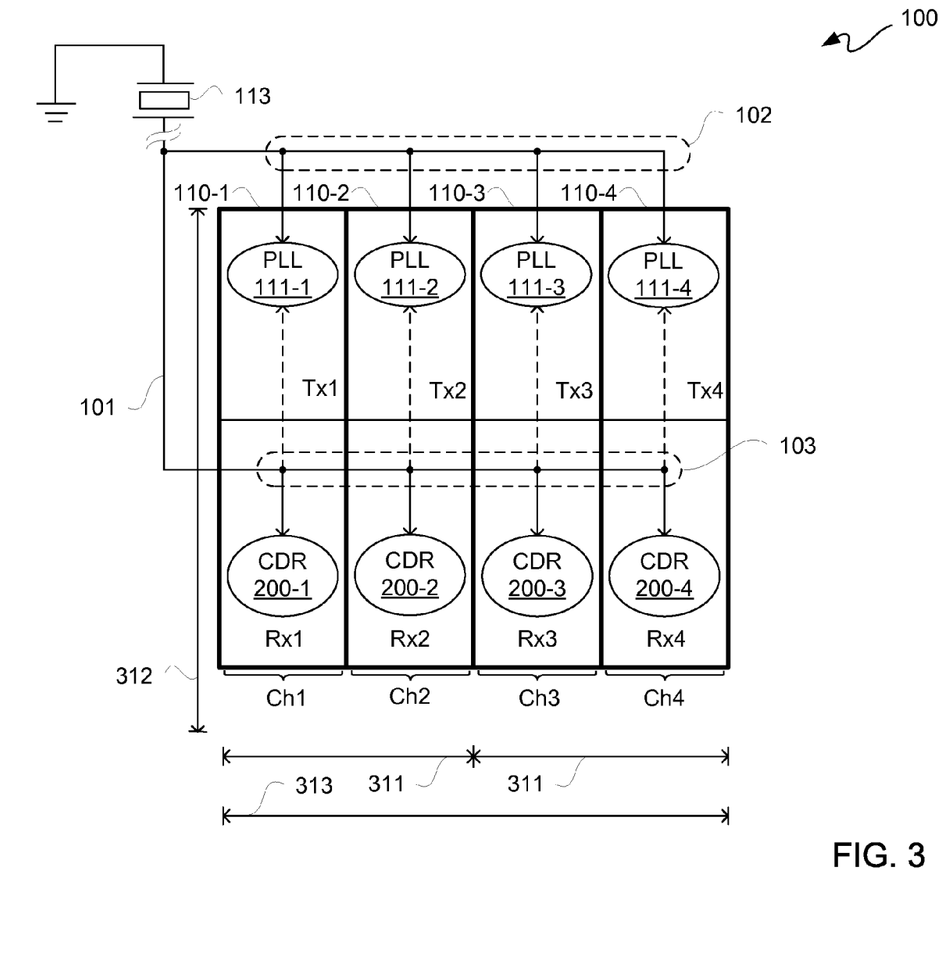
FIG. 3 is a block diagram an exemplary transceiver bank including CDR blocks of FIG. 4.

FIG. 3 is a block diagram an exemplary transceiver bank 100. Transceiver bank 100 may be in an IC, such as an FPGA or other IC. In this example, transceiver bank 100 includes four transceivers 110-1 through 110-4 (singly and collectively transceivers 110) coupled to a single common reference oscillator 113.

Even though four transceivers 110 are illustratively depicted, fewer or more than four transceivers 110 may be used in other implementations. Reference oscillator 113 may be internal or external with respect to an IC hosting transceiver bank 100, such as a single external crystal oscillator in this example. In this example, it is assumed that reference oscillator 113 operates to provide at least approximately a 1 GHz reference frequency signal ("reference signal") 101. However, other reference frequencies may be used in other implementations of reference signal 101.

Reference signal 101 may be routed over substantial distances, externally and internally, to clock buses 102 and 103 of a clock network of a host microelectronic device. Clock buses 102 and 103 may be used for respectively providing reference signal 101 to transmitters Tx1, Tx2, Tx3, Tx4 and receivers Rx1, Rx2, Rx3, Rx4 corresponding to transceivers 110-1 through 110-4. Along those lines, PLL blocks 111-1 through 111-4 corresponding to transmitters Tx1, Tx2, Tx3, Tx4 and CDR blocks 200-1 through 200-4 corresponding to receivers Rx1, Rx2, Rx3, Rx4 may all be commonly coupled to one another to receive a single reference signal 101 from a single reference oscillator 113.

Clock buses 102 and 103 may contribute to such routing distances, and so, optionally, a single common clock bus 103 may be used to provide reference signal 101 to transmitters Tx1, Tx2, Tx3, Tx4 and receivers Rx1, Rx2, Rx3, Rx4 corresponding to transceivers 110-1 through 110-4, as generally indicated with dashed-arrows emanating from such clock bus 103. Optionally, reference signal 101 may be routed to a central region of clock bus 103 and/or clock bus 102 before being routed to transceivers 110 to further equalize routing delay among like situated components of transceivers 110. Along those lines, reference oscillator 113 may be coupled to transmitter PLL blocks 111-1 through 111-4 respectively of transmitters Tx1, Tx2, Tx3, Tx4 to provide reference signal 101 to each of such PLL blocks 111.

Reference oscillator 113 may be coupled to CDR blocks 200-1 through 200-4 (singly and collectively CDR block 200) respectively of receivers Rx1, Rx2, Rx3, Rx4 to provide reference signal 101 to each of such CDR blocks 200. In this example, transceivers 110-1 through 110-4 are respectively for channels Ch1, Ch2, Ch3, and Ch4. Accordingly, transceiver bank 100, and in particular CDR blocks 200 thereof, may be for one or more serial links via one or more of channels or lanes Ch1 through Ch4 system for supporting multiple frequencies via multiple lanes. In other words, two or more of CDR blocks 200 may operate at different reception frequencies with respect to data recovered clocks from received input data from corresponding channels. Accordingly, two or more of CDR blocks 200 may be considered a serial link system for supporting multiple frequencies via multiple lanes. Again, such serial link systems may be referred to as multi-standard serial link systems.

For purposes of clarity by way of example and not limitation, it shall be assumed transceiver bank 100 has an overall width/height 313 of approximately 2 mm and an overall height/width 312 of approximately 2 mm. In this example, each pair of adjacent transceivers 110 has a width 311 of approximately 1 mm. However, these or other dimensions may be used in other implementations.

Routing of a high-frequency clock signal is avoided by routing of a low-frequency reference signal 101. Again, by a low-frequency reference, it is generally meant in relationship to frequency of a data rate. Thus, a high frequency may be a multiple of a low frequency. For purposes of clarity by way of example and not limitation, it shall be assumed that a low-frequency signal is approximately 1 to 4 GHz and a high-frequency signal is approximately 5 GHz or greater. More particularly, for purposes of clarity by way of example and not limitation, it shall be assumed that reference signal 101 has a reference frequency of approximately 1 GHz and that a high-frequency signal generated in a CDR block 200 is approximately 5 to 10 GHz. However, these and/or other frequencies may be used in other implementations.

Accordingly, providing a high-frequency signal over a significant routing distance via a host clock network may be avoided, and so a significant reduction in the amount of clock distribution power consumed may be obtained by routing a low-frequency reference signal distributed via a host network for/to one or more channels. In other words, power dissipation for clock distribution may be substantially reduced in contrast to a multi-lane transceiver with a common high-frequency reference signal. To quantify such power reduction, clock distribution power is directly proportional to clock frequency for a first order approximation. For example, reducing distributed clock frequency from 10 GHz to 1 GHz may result in a first order approximation of a 90% reduction in clock distribution power. For a power budget for a high-speed serial link transceiver, clock distribution power may account for approximately 40% of such overall power budget. Therefore, even with adding power consumption for distributing a high-frequency clock signal within a CDR block for each lane, considerable power savings may be obtained as described herein.

Again, with respect to power consumption of a transceiver, conventionally an Rx CDR block may consume a significant amount of power as compared for example with a Tx PLL block. Therefore, providing a low-power Rx CDR block as described herein may be desirable and useful.

Again, CDR blocks 200 may correspond to multiple lanes or channels, such as channels Ch1 through Ch4 in this example, and CDR blocks 200 may be commonly coupled for receiving a same reference signal 101, where reference signal 101 is a low-frequency signal. To be able to use a low-frequency reference signal 101, as well as to accommodate a wide range of frequencies without discontinuities in such wide range of frequencies, each of CDR blocks 200 may include: a fractional-N PLL having a ring oscillator for providing an oscillation signal at a clock frequency substantially greater than a reference frequency of reference signal 101; and a data-to-frequency control word converter for receiving a data input for a corresponding lane of multiple lanes or channels. Such data-to-frequency control word converter may receive such locally generated high-frequency oscillation signal within a CDR block for providing a frequency control word to such fractional-N PLL.

Even with a separate fractional-N PLL for each channel, CDR blocks 200 are still power efficient as they do not include one or more delay-locked loops ("DLLs") and do not include one or more phase interpolators ("PIs"), among other components found in other CDR devices. Therefore, CDR blocks 200 may be more power efficient than an implementation in which channels share a fractional-N PLL but include one or more DLLs and/or PLLs. Additionally, each of CDR blocks 200 may include only two accumulators in separate portions of each CDR block to reduce loop latencies in such CDR blocks. Along those lines, it should be understood that an accumulator may introduce at least one extra cycle of delay.

Figure 4:
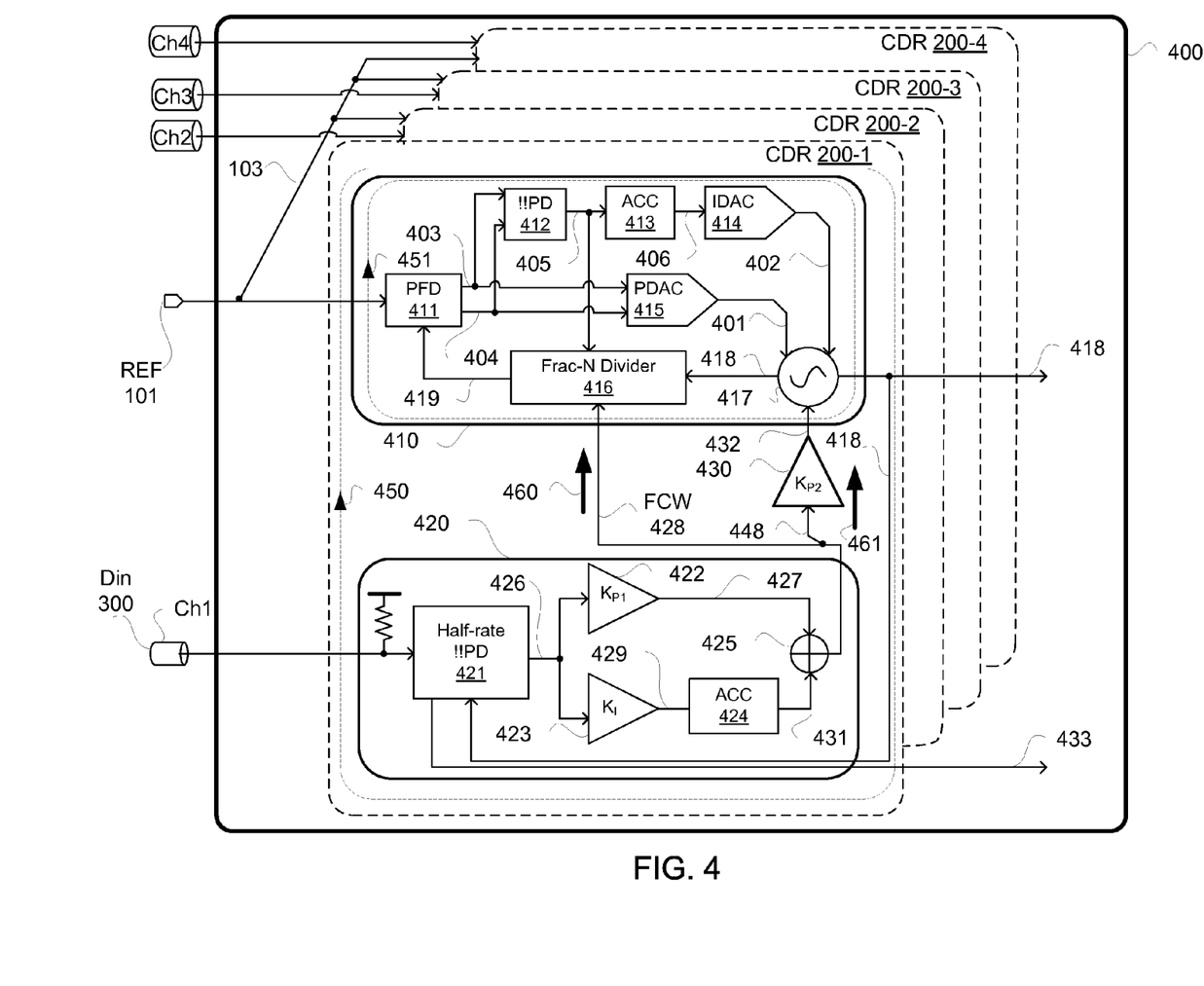
FIG. 4 is a schematic diagram depicting exemplary CDR blocks commonly coupled to receive a reference signal via a clock bus of a host microelectronic device.

FIG. 4 is a schematic diagram depicting exemplary CDR blocks 200. CDR blocks 200 may be commonly coupled to receive a single reference signal 101 via a clock bus 103 of a host microelectronic device 400. Host microelectronic device 400 may be an FPGA or other IC having two or more receivers employing corresponding CDR blocks 200. As CDR blocks 200-1 through 200-4 are all the same though each may be configured to operate at same and/or different frequencies, only CDR block 200-1 is illustratively depicted and described below in detail for purposes of clarity.

CDR block 200-1 includes a fractional-N PLL 410 and a data-to-frequency control word converter 420. Optionally, CDR block 200-1 may include a buffer 430 for providing dual-output path coupling from data-to-frequency control word converter 420 to fractional-N PLL 410.

Fractional-N PLL 410 may include a phase-frequency detector ("PFD") 411, a phase detector ("PD") 412, an accumulator ("ACC") 413, a digital-to-analog converter ("DAC") 414, a DAC 415, a digitally controlled oscillator ("DCO") 417, and a fractional-N divider 416. In this example DCO 417 is a ring oscillator 417. More particularly, in this example, ring oscillator 417 is a current-controlled oscillator ("CCO") type of ring oscillator. A ring oscillator 417 may be used to support a wide range of clock frequencies with multiple phases. Moreover, such multiple phases may be equally spaced. However, in another implementation, another type of DCO 417 may be used.

Accordingly, CDR block 200-1 may support multiple communication specifications covering a variety of frequencies with a single reference oscillator 113. Moreover, bandwidth of fractional-N PLL 410 may be sufficiently large, such as equal to or greater than approximately 50 MHz, to suppress noise of ring oscillator 417 in order to have adequate jitter performance for a recovered clock, namely oscillation signal 418 which may be output from CDR block 200-1. In other words, CDR block 200-1 effectively decouples the tradeoff between oscillator noise suppression and input data jitter filtering by providing a high bandwidth fractional-N PLL 410 to suppress oscillator noise. A ring oscillator 417 may include a loop of a series of inverters as is known.

Fractional-N PLL 410 may be coupled for receiving a reference signal 101 for providing a proportional signal 401 and an integral signal 402. In this example, proportional signal 401 and integral signal 402 respectively are a proportional current signal 401 and an integral current signal 402 respectively output from DAC 415 and DAC 414. Accordingly, DAC 414 is referred to as an integral DAC ("IDAC") 414, and DAC 415 is referred to as a proportional DAC ("PDAC") 415; however, both DACs are simply DACs named to delineate the two uses.

Ring oscillator 417 of fractional-N PLL 410 may be coupled for receiving proportional signal 401 and integral signal 402 for providing an oscillation signal 418. Oscillation signal 418 may be at a clock frequency substantially greater than a reference frequency of reference signal 101. In this example, oscillation signal 418 is at approximately 8 GHz. Oscillation signal 418 may have a clock pattern. Oscillation signal 418 may be provided as a feedback loop signal to fractional-N divider 416 and as a feedback loop signal to a phase detector 421 of data-to-frequency control word converter 420. Phase detector 421 may output recovered data 433, which may be output from CDR block 200-1, using a recovered clock signal, namely oscillation signal 418.

In addition to phase detector 421, data-to-frequency control word converter 420 includes a buffer 422, a buffer 423, an accumulator 424, and an adder 425. Data-to-frequency control word converter may be coupled for receiving data input 300 and oscillation signal 418 for providing a frequency control word ("FCW") or FCW signal 428. Data input 300 may be the received data via a channel or lane, which in this example is a channel Ch1. Along those lines, for this example of four channels, each channel Ch1 through Ch4 may be an independent data input respectively provided to CDR blocks 200-1 through 200-4, as illustratively depicted.

Fractional-N divider 416 of fractional-N PLL 410 may be coupled for receiving a frequency control word 428 and oscillation signal 418 for providing a feedback clock signal 419 to phase-frequency detector 411 of fractional-N PLL 410. Effectively, frequency control word 428 may be determined from a recovered clock frequency by data-to-frequency control word converter 420. Frequency control word 428 may be used to set fractional-N divider to divide frequency of oscillation signal 418 to provide feedback clock signal 419 with a frequency adjusted for such recovered clock frequency.

Accordingly, CDR block 420-1 may automatically adjust to a clock frequency in data input 300. Such adjustment may be for supporting any of multiple frequencies, and thus possibly multiple communication protocols, with a single CDR block 200-1, as fractional-N PLL 410 may be capable of handling a wide variety of frequencies within a frequency bandwidth thereof. Moreover, fractional-N PLL 410 may support such frequency bandwidth without having discontinuities therein while being sourced from a single reference frequency of reference signal 101. Phase-frequency detector 411 of fractional-N PLL 410 may be coupled for receiving reference signal 101 and feedback clock signal 419 for adjusting the phase and frequency of oscillation signal 418.

Accordingly, oscillation signal 418 and ring oscillator 417 may be local to CDR 200-1, such as may be internal to CDR 200-1. Additionally, because ring oscillator 417 is compact, there may a separate ring oscillator 417 for each CDR block 200, where each such ring oscillator 417 may be dedicated to a receiver lane for such CDR block assigned to such receiver lane, which in this example is CDR block 200-1 assigned to channel Ch1.

Additionally, in this example, phase detector 412 is a bang-bang phase detector ("!!PD"), and phase detector 421 is a bang-bang phase detector. More particularly, phase detector 421 in this example is a half-rate bang-bang phase detector. Accordingly, other than analog portions of IDAC 414 and PDAC 415 used to provide respective current biases to bias inverters of ring oscillator 417, CDR block 200-1 is digital. This substantially digital configuration may be more compact than a configuration with more analog components, and thus CDR block 200-1 may be positioned proximate to a channel interface of channel Ch1 in a host microelectronic device. Generally, integral signal 402 is an integral current bias for adjusting frequency of oscillation signal 418 output from ring oscillator 417, and proportional signal 401 is a proportional current bias for adjusting the phase of oscillation signal 418 output from ring oscillator 417.

With the above-description of FIG. 4 borne in mind, additional details regarding CDR 200-1 are described below.

With reference to data-to-frequency control word converter 420, phase detector 421 may receive data input 300 and oscillation signal 418 for providing a phase detection signal 426. Phase detection signal 426 may be input to buffers 422 and 423. Buffer 422 may be set to scale input thereto with a first proportionality scaling factor or constant ($K_{P1}$), and so output from buffer 422 may be a proportionality scaled version of phase detection signal 426, namely a scaled value 427. Buffer 423 may be set to scale input thereto with an integral scaling factor or constant ($K_I$), and so output from buffer 423 may be an integral scaled version of phase detection signal 426, namely a scaled value 429.

Accumulator 424 may be coupled for accumulating scaled values 429 output from buffer 423 for providing an accumulated value 431. Adder 425 may be coupled for adding an accumulated value 431 and a scaled value 427 to provide a frequency control word 428. Frequency control word 428 may be a control input to fractional-N divider 416 for one control path to fractional-N PLL 410. A buffer 420 may be coupled for receiving a phase portion 448 of such a frequency control word 428 for scaling with a second proportionality constant ($K_{P2}$) to provide a scaled value 432. Scaled value 432 is a scaled phase value. Ring oscillator 417 may be coupled for receiving scaled phase value 432 to control phase margin of fractional-N PLL 410 for another control path to fractional-N PLL 410.

In this dual-control of fractional-N PLL 410, a frequency control path 460 is mainly responsible for controlling tracking of frequency for frequency locking, in part responsive to a frequency control word 428 input to fractional-N divider 416, and a phase control path 461 directly to oscillator 417 may assist in phase tracking for phase locking, in part responsive to a scaled phase value 432 input to oscillator 417. Thus, both frequency and phase locking may both be obtained by a fractional-N PLL 410.

With respect to phase control path 461, this path effectively bypasses loop delay in fractional-N PLL 410 for adjusting the phase of oscillator 417. This phase control path 461 may in effect be used to provide an instantaneous phase value to oscillator 417. Along those lines, phase margin of fractional-N PLL 410 may be increased by use of such a phase control path 461. For example, phase margin of fractional-N PLL 410 may be controlled to be equal to or greater than 60 degrees.

With reference to fractional-N PLL 410, phase detector 412 may be coupled for receiving an up signal 403 and a down signal 404 from phase-frequency detector 411 for providing an error signal 405 as an output. Even though signal lines are illustratively depicted as single lines for purposes of clarity, in instances these signal lines may represent a signal bus having multiple lines. For example, both frequency control word 428 and error signal 405 may each be k-bits wide or long, for k a positive integer greater than one. Fractional-N divider 416 may be coupled for receiving an error value from error signal 405.

Accumulator 413 may be coupled for accumulating error values from error signal 405 for providing an accumulated value 406. IDAC 414 may be coupled for receiving a digital accumulated value for providing an analog integral signal 402. PDAC may be coupled for receiving digital up signal 403 and digital down signal 404 from phase-frequency detector 411 for providing an analog proportional signal 401.

To recapitulate, CDR block 200-1 includes a CDR loop and a fractional-N PLL loop. Such fractional-N PLL loop, generally indicated as loop 451 is entirely within fractional-N PLL 410. However, such fractional-N PLL loop is embedded in such CDR loop, generally indicated as loop 450, within CDR block 200-1. Accordingly, within such fractional-N PLL loop, both frequency tracking and phase tracking may be performed, without having to have a phase interpolator included in CDR block 200-1 for such frequency and phase tracking.

Additionally, because fractional-N PLL 410 is embedded in a CDR system loop 450, frequency of oscillation signal 418 output from a DCO, such as ring oscillator 417, may be exactly the same as frequency of an input data rate of data input 300 during steady-state operation of CDR block 200-1 when locked by frequency of reference signal 101. In this state, CDR block 200-1 can tolerate many consecutive identical digits ("CIDs") for an input data pattern of data input 300 without losing lock. Without wishing to be bound by theory, an infinite amount of CIDs may be input without losing lock in such steady state operation of CDR block 200-1. This feature can be useful in some circumstances; for instance in burst-mode CDR, where an OFF period is similar to a CID condition, where frequency and phase locking may be maintained for an arbitrarily long OFF period. Thus, data from data input 300 may be correctly recovered at the first data bit when a new burst starts even after such a long OFF period.

As previously described, fractional-N PLL 410 may be controlled with dual-path control, namely a fractional-N divider control path 460 and an oscillator control path 461. Such control paths 460 and 461 may reduce loop latency of loop 451 with respect to frequency and phase tracking, respectively. Such reduction in loop latency may increase bandwidth capacity of CDR block 200-1 without diminishing phase margin.

During steady-state operation of CDR 200-1, ring oscillator 417 may be adjusted with frequency tracking provided with CDR loop 450 to oscillate at a same frequency and in-phase with an input data rate of data input 300. Moreover, data sampling clock phases may be adjusted with phase tracking provided with CDR loop 450 for phase alignment, which may be useful for sampling data in the middle, or proximate thereto, of an input data eye.

Figure 5:
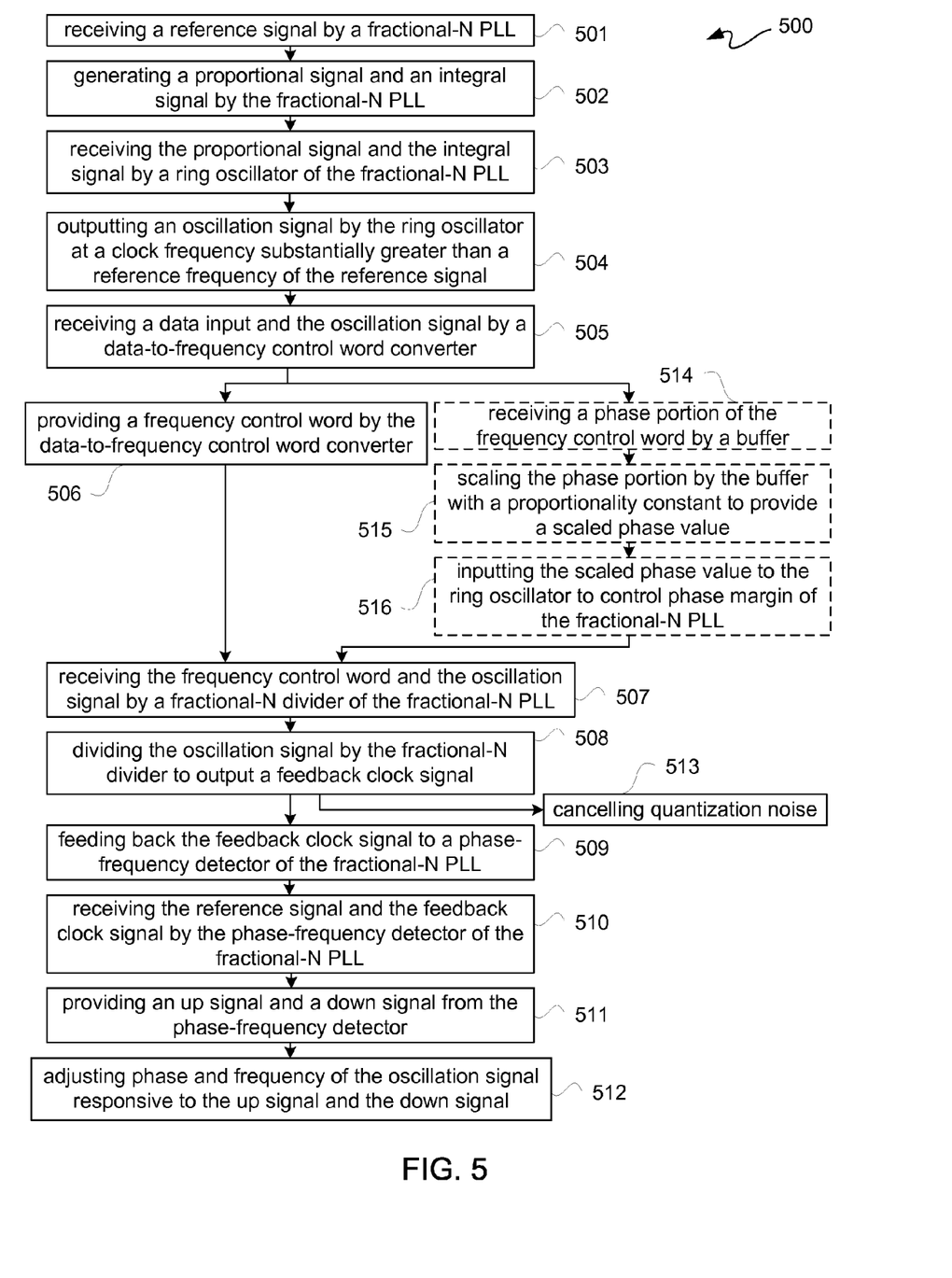
FIG. 5 is a flow diagram depicting an exemplary operational flow for a CDR block of FIG. 4.

FIG. 5 is a flow diagram depicting an exemplary operational flow 500 for CDR block 200-1 of FIG. 4. Operational flow 500 is further described with simultaneous reference to FIGS. 4 and 5.

At 501, a reference signal 101 may be received by a fractional-N PLL 410. At 502, a proportional signal 401 and an integral signal 402 may be generated by fractional-N PLL 410. At 503, proportional signal 401 and integral signal 402 may be received by a ring oscillator 417 of fractional-N PLL 410.

At 504, an oscillation signal 418 may be output by ring oscillator 417 at a clock frequency substantially greater than a reference frequency of reference signal 101. At 505, a data input 300 and oscillation signal 418 may be received by a data-to-frequency control word converter 420. At 506, a frequency control word 428 may be provided by data-to-frequency control word converter 420.

Optionally, in parallel with the operation at 506, dual-control may be provided with operations 514 through 516. Along those lines, at 514, a phase portion of frequency control word 428 may be received by a buffer 430. At 515, such phase portion may be scaled by buffer 420 with a proportionality constant to provide a scaled phase value 432. At 516, such scaled phase value may be input to ring oscillator 417 to control phase margin of fractional-N PLL 410 for providing oscillation signal 418.

At 507, frequency control word 428 and oscillation signal 418 may be received by a fractional-N divider 416 of fractional-N PLL 410. At 508, oscillation signal 418 may be divided by fractional-N divider 416 to output a feedback clock signal 419. This division by fractional-N divider 416 at 508 may further include cancellation of quantization noise at 513 by fractional-N divider 416. Cancellation of quantization noise by fractional-N divider 416 is described below in additional detail.

At 509, feedback clock signal 419 may be fed back to a phase-frequency detector 411 of fractional-N PLL 410. At 510, reference signal 101 and feedback clock signal 419 may be received by phase-frequency detector 411 of fractional-N PLL 410.

At 511, an up signal 403 and a down signal 404 may be provided from phase-frequency detector 411. At 512, phase and frequency of oscillation signal 418 may be adjusted responsive to up signal 403 and down signal 404.

Figure 6:
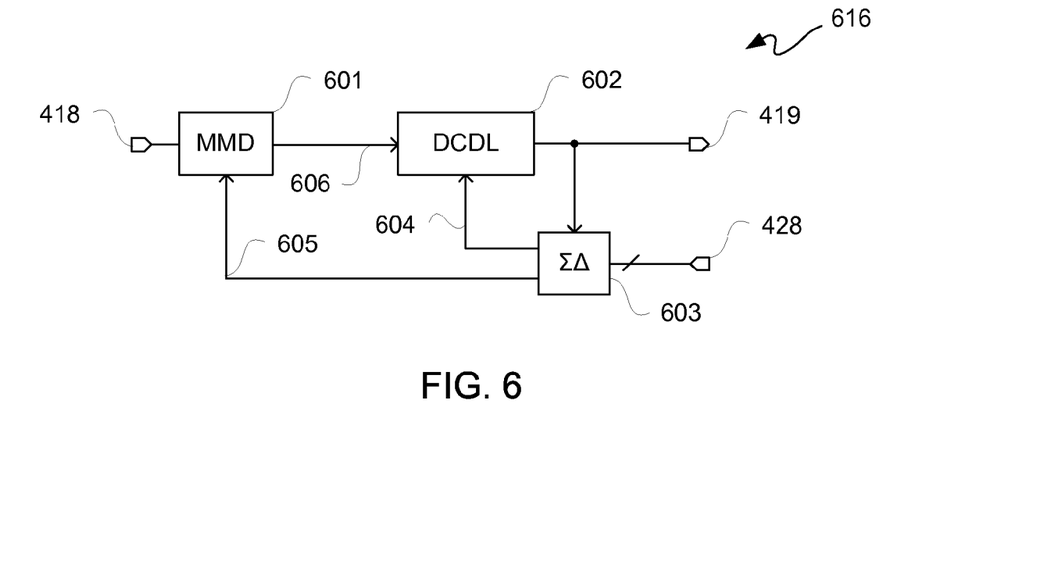
FIG. 6 is a block diagram depicting an exemplary fractional-N divider, which may be used for a fractional-N divider in a CDR block of FIG. 4.

FIG. 6 is a block diagram depicting an exemplary fractional-N divider 616. Fractional-N divider 616 may be used for fractional-N divider 416 of FIG. 4. In this example, fractional-N divider 616 includes a delta-sigma ("ΔΣ") modulator 603, a multi-modulus divider ("MMD") 601, and a digitally-controlled delay line ("DCDL") 602. In order to reduce contribution of ΔΣ modulator 603 to quantization noise, quantization noise cancellation may be provided by fractional-N divider 616. This quantization noise cancellation may be performed in the background with respect to operation of fractional-N PLL 410.

A frequency control word 428 may be a k-bit input to ΔΣ modulator 603. Output from ΔΣ modulator 603 for such frequency control word 428 may be a k-bit value for quantization noise ("q[k]") via quantization noise signal 604 and a kit-bit divisor value ("div[k]") associated with such quantization noise via divisor signal 605. Such k-bit divisor values may be provided from ΔΣ modulator 603 as a control input divisor signal 605 to multi-modulus divider 601. Such k-bit quantization noise value may be provided as quantization noise signal 604 from ΔΣ modulator 603 as a control input to DCDL 602.

Multi-modulus divider 601 may be coupled to receive oscillation signal 418 as a clock input signal to provide a clock signal, namely clock-MMD signal 606, as an input to DCDL 602. DCDL 602 may be coupled to provide a clock output signal as feedback clock signal 419, and feedback clock signal 419 may be provided as an input to phase-frequency detector 411, as previously described, as well as an input to ΔΣ modulator 603.

Because quantization noise q[k] is periodic and deterministic, such quantization noise may be cancelled before providing feedback clock signal 419 to phase-frequency detector 411. Generally, quantization noise cancellation may be performed by DCDL 602 by removing an amount of accumulated phase error in clock-MMD signal 606 using quantization noise signal 604 to remove such accumulated phase error and then an outputting a clock signal as feedback clock signal 419 in fractional-N PLL 410. This accumulated phase error may at least in part be associated with phase noise of ring oscillator 417. However, with such cancellation, phase-frequency detector 411 may see little, if any, accumulated phase error in feedback clock signal 419.

Range of DCDL 602 may be equal to exactly one input cycle of an input clock signal, namely oscillation signal 418 in this example, for synchronization with a first order ΔΣ modulator 603 for alignment of quantization noise signal 604 with associated noise in oscillation signal 418 for complete quantization noise cancellation in feedback clock signal 419 output from DCDL 602. While an overall input clock signal of a CDR block 200-1 may be thought of as reference signal 101, for fractional-N divider 616 an input clock signal is input to MMD 601, which in this example is oscillation signal 418. Moreover, oscillation signal 418 may be a CDR recovered clock signal. If this alignment is off, then there may be residual quantization error appearing in error signal 405 as e[k]. Feedback clock signal 419 output from DCDL 602 may be fed back as a clock to ΔΣ modulator 603 for tracking interval boundaries, such as of intervals 711 described below with reference to FIG. 7, for outputting signals 604 and 605.

As described above, a FCW provided via FCW signal 428 depends on a relationship between reference signal 101 and data input 300, where data input 300 may have a data rate or input frequency unknown by CDR block 200-1. However, CDR block 200-1 is configured to generate an FCW, which may be an optimum FCW for an application. In other words, CDR loop 450 may operate to automatically converge to an optimum FCW, which should be a division of an input data rate of data input 300 and a reference frequency of reference signal 101.

Figure 7:
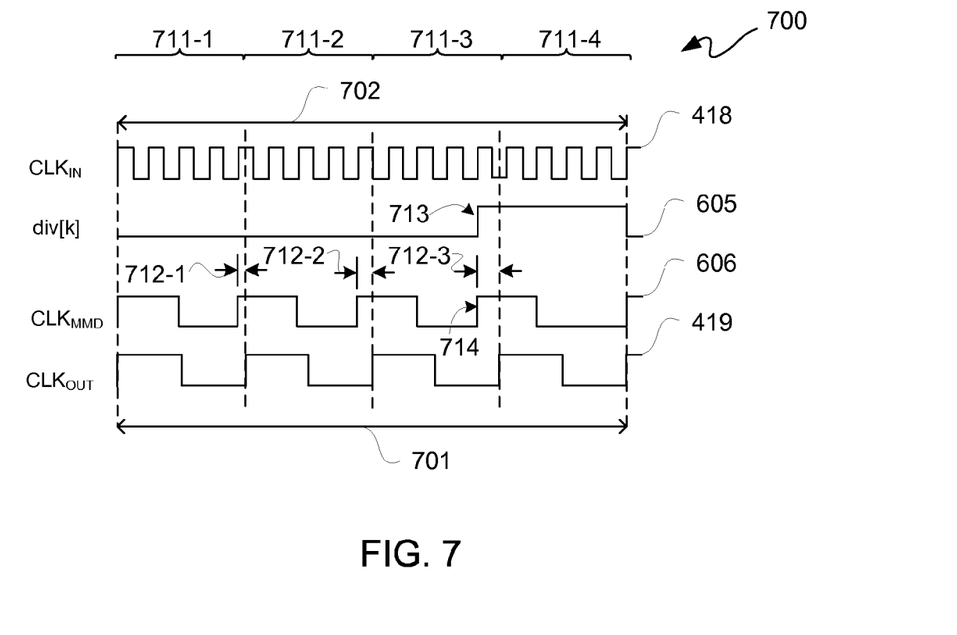
FIG. 7 is a signal diagram depicting an exemplary signal timing for a fractional-N frequency control word ("FCW").

Along those lines, FIG. 7 is a signal diagram depicting an exemplary signal timing 700 for a fractional-N FCW 428. In this example, FCW is equal to 4.25. Even though the example of an FCW equal to 4.25 is described below, this example is for purposes of clarity by way of example and not limitation, as generally any fraction likely to be incurred associated with received data may be used for FCW. Signal timing 700 is further described with simultaneous reference to FIGS. 6 and 7.

Oscillation signal 418 may be received as an input clock signal by a fractional-N divider 616 of FIG. 6. In this example, there are 17 cycles 702 of oscillation signal 418 for every 4 cycles 701 of a corresponding output clock signal, which in this example is feedback clock signal 419. Accordingly, the ratio of 4/17 is equal to 4.25, which is the value of an FCW 428 in this example. For this example, there are thus four equal intervals 711 associated with four corresponding periods of such output clock signal, namely feedback clock signal 419 in this example. For this example, these four equal intervals 711 correspond to a sequence of four values of q[k] for quantization noise, such as via quantization noise signal 604 of FIG. 6. Again, it should be appreciated for this example that div[k], e[k] and q[k] are respective k-bit digital values. Furthermore, quantization noise which is present for a fractional-N FCW may not be present for an integer-N FCW should such relationship exist between an input data rate and a reference frequency.

In this example, intervals 711-1 through 711-4 respectively correspond to q[k] values of 0.25, 0.50, 0.75, and 0.00 provided via quantization noise signal 604. For div[k] division factors or values provided via divisor signal 605 associated with such q[k] values, in this example such values are 4, 4, 4, and 5. These div[k] values correspond to the number of cycles of an input clock signal, namely oscillation signal 418 in this example, and total to 17 cycles 702 of oscillation signal 418 for every 4 cycles 701 of an output clock signal, namely feedback clock signal 419 in this example.

Accordingly, clock-MMD signal 606 output from MMD 601 has a period equal to 4 cycles of oscillation signal 418 in this example associated with a first three periods of a sequence of cycles of feedback clock signal 419, and clock-MMD signal 606 output from MMD 601 has a period equal to 5 cycles of oscillation signal 418 in this example associated with a final period of such sequence of cycles of feedback clock signal 419. MMD 601 may be configured to provide only integer numbers of cycles for such division. In this example, MMD 601 switches between a 4 cycle set and a 5 cycle set, 3 sets of 4 cycles followed by one set of 5 cycles, and then MMD 601 may repeat this sequence.

Clock-MMD signal 606 input to DCDL 602 is thus progressively adjusted responsive to q[k] values by amounts of time 712-1 through 712-3. Effectively, DCDL 602 may be used as a phase shifter.

Periods of clock-MMD signal 606 may be adjusted by DCDL 602 with progressively increasing amounts of time 712-1 through 712-3 corresponding to q[k] values of 0.25, 0.50, and 0.75 in this example to fill and phase align to intervals 711-1 through 711-3, respectively. These progressive amounts of time 712-1 through 712-3 may represent accumulated phase error, namely quantization noise associated with fractional-N operations. Therefore, this pattern of accumulated phase error is both repetitive and deterministic.

However, transition 713 of divisor signal 605 indicates the beginning of a period equal to 5 cycles of oscillation signal 418, which completely spans interval 711-4 for a corresponding cycle of clock-MMD signal 606. For this period of 5 cycles of oscillation signal 418, q[k] has a value of 0.00, and so there is no adjustment by DCDL 602 other than to delay a leading or rising edge 714 of clock-MMD signal 606 for providing a cycle of feedback clock signal 419 for interval 711-4. In other words, accumulated phase error may be completely cancelled out by this extra cycle, which is a fifth cycle of oscillation signal 418 in this example. Thus, effectively, a FCW 428 of 4.25 causes MMD 601 to divide by either 4 or 5, as described above.

Figure 8:
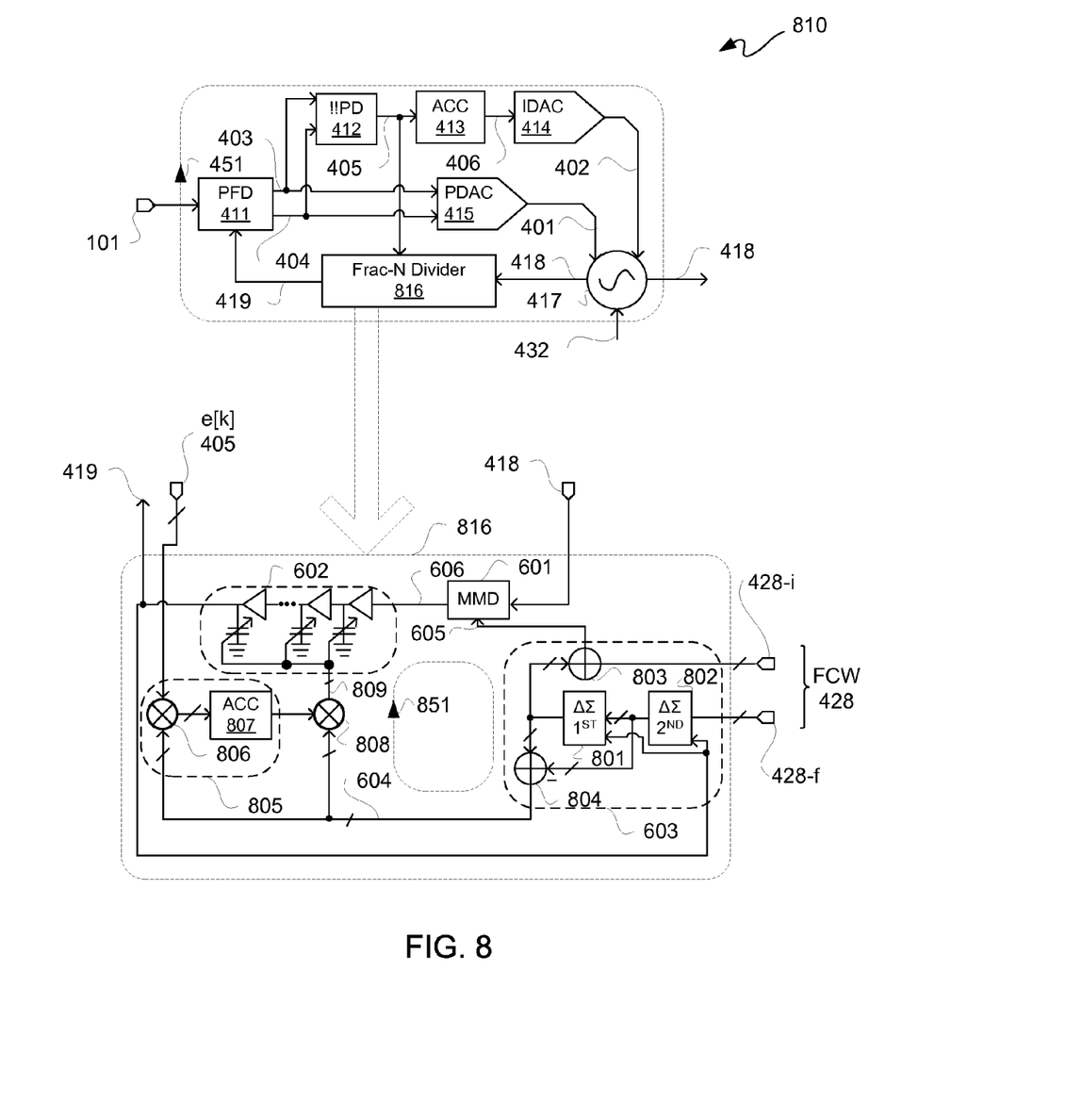
FIG. 8 is a block diagram depicting a hybrid fractional-N PLL, which may be used in a CDR block of FIG. 4.

FIG. 8 is a block diagram depicting a hybrid fractional-N PLL 810. Hybrid fractional-N PLL 810 may be used instead of fractional-N PLL 410 in a CDR block 200, such as described with reference to FIG. 4.

Hybrid fractional-N PLL 810 of FIG. 8 is the same as fractional-N PLL 410 of FIG. 4, except for substitution of fractional-N divider 816 for fractional-N divider 416 of FIG. 4. Accordingly, for purposes of clarity, generally only fractional-N divider 816 of FIG. 8 of hybrid fractional-N PLL 810 is described in detail below, where a recovered clock, namely oscillation signal 418, is provided as an input clock signal along with an FCW 428. It should be understood that via a CDR loop, as described above, FCW 428 may be automatically adjusted responsive to data rate of data input 300.

In this example, fractional-N divider 816 includes a delta-sigma ("$\Delta\Sigma$") modulator 603, a multi-modulus divider ("MMD") 601, a digitally-controlled delay line ("DCDL") 602, a correlator 805 and a multiplier 808. Again, in order to reduce contribution of $\Delta\Sigma$ modulator 603 to quantization noise, quantization noise cancellation may be provided by fractional-N divider 816. This quantization noise cancellation may be performed in the background with respect to operation of hybrid fractional-N PLL 410.

A frequency control word 428 may be a k-bit input to $\Delta\Sigma$ modulator 603, which may be parsed as an integer portion, namely FCW 428-$i$, and a fraction portion, namely FCW 428-$f$. In the above example of FCW equal to 4.25, FCW 428-$i$ may represent 4, and FCW 428-$f$ may represent 0.25.

Output from $\Delta\Sigma$ modulator 603 for such frequency control word 428 may be a k-bit value for quantization noise ("q[k]") via quantization noise signal 604 and a kit-bit divisor value ("div[k]") associated with such quantization noise via divisor signal 605. Such k-bit divisor values may be provided from $\Delta\Sigma$ modulator 603 as a control input divisor signal 605 to multi-modulus divider 601. Such k-bit quantization noise value may be provided as quantization noise signal 604 from $\Delta\Sigma$ modulator 603 as a control input to be adjusted prior to input to DCDL 602.

In this example, $\Delta\Sigma$ modulator 603 includes a first-order $\Delta\Sigma$ modulator 801, a second order $\Delta\Sigma$ modulator 802, an adder 803, and a subtractor 804. FCW 428-$f$ is input to second-order $\Delta\Sigma$ modulator 802, and output from second-order $\Delta\Sigma$ modulator 802 is input to a minus port of subtractor 804 and to first-order $\Delta\Sigma$ modulator 801. Output of first-order $\Delta\Sigma$ modulator 801 is input to a plus port of subtractor 804 and a port of adder 803. Another input to adder 803 is FCW 428-$i$ for addition with output of first-order $\Delta\Sigma$ modulator 801 to output divisor signal 605 to MMD 601.

Output from second-order $\Delta\Sigma$ modulator 802 is subtracted from output of first-order $\Delta\Sigma$ modulator 801 by subtractor 804 to output a quantization noise signal 604. Generally, first-order $\Delta\Sigma$ modulator 801 is coupled with subtractor 804 effectively as an accumulator to accumulate quantization noise, or phase error, output from second-order $\Delta\Sigma$ modulator 802. Continuing the above example, 0.25 may be the accumulated phase error for each of three cycles of an output clock signal, such as feedback clock signal 419. On a fourth cycle of such an output clock signal, the accumulated phase error is equal to 1, which is an integer. This accumulated integer 1 is effectively added to integer 4 to input an integer 5 for FCW 428-$i$, namely for five cycles of an input clock signal, namely oscillation signal 418, instead of four cycles thereof in the example. Accordingly, there may be three cycles of an output clock signal, namely feedback clock signal 419, with division by 4 and one cycle of an output clock signal, namely feedback clock signal 419, with division by 5 for the above described example. In other words, q[k] equal to 0.00, means an integer 1 has been added to integer 4 to provide an integer 5 for division for that cycle.

Quantization noise signal 604 may be provided as input to multiplier 808 and to multiplier 806 of correlator 805. Another input to multiplier 806 may be error signal 405, and output of multiplier 806 may be input to accumulator 807 of correlator 805. Accordingly, correlator 805 may be a least mean squared ("LMS") correlator.

Though operation of fractional-N PLL 410 may not have e[k] error fed back as described herein, without such feedback quantization noise q[k] in feedback clock signal 419 processed by phase-frequency detector 411 and phase detector 412, to do so would introduce error in such fractional-N PLL loop. This might result in a phase error, which may appear as a cyclicly repeating "sawtooth" behavior. Thus, by feeding back error e[k] output from phase detector 412, performance of fractional-N PLL 410 may be enhanced. In other words, by providing e[k] to correlator 805, correlation between e[k] and q[k] may essentially be removed so as not to be injected into such fractional-N PLL loop.

Again, because q[k] is deterministic and periodic, an accumulation of error e[k] in correlator 805 may be used for convergence to eventually prevent phase error from being injected into such fractional-N PLL loop. Along those lines, gain of DCDL 602 may be calibrated as instantaneous frequency of ring oscillator 417 may become more stable with less jitter due to such background feedback quantization noise cancellation for steady-state operation of fractional-N PLL 810. Thus, a calibration loop 851, which may be nested or embedded in fractional-N PLL loop 451 may be used for such convergence.

Fractional-N PLL loop 451 may have a bandwidth greater than approximately 80 MHz. For example, bandwidth of fractional-N PLL loop 451 may be in a range of approximately 100 to 150 MHz. Bandwidth of CDR loop 450 may be less than approximately 20 MHz. For example, bandwidth of CDR loop 450 may be in a range of approximately 10 to 15 MHz for example, or generally about $\frac{1}{10}^{th}$ the bandwidth of fractional-N PLL loop 451. Bandwidth of calibration loop 851 may be in a range of approximately 100 kHz to 1 MHz. More generally, bandwidth of calibration loop 851 may be high enough to track temperature variations of a DCO 417 and/or a DCDL 602, and bandwidth of calibration loop 851 may be low enough to not disturb overall loop dynamics of the overall CDR loop 450.

Output of LMS correlator 805 may be provided as another input to multiplier 808. Output of multiplier 808 may be adjusted quantization noise signal 809, which is provided as a control input to DCDL 602 instead of quantization noise signal 604 as in the example of FIG. 6. DCDL 602 may use such adjusted quantization noise signal 809 to adjust adjustable capacitances thereof associated with output taps of a series of buffers thereof, where a final tap of such series may be used to source feedback clock signal 419.

Using correlation between e[k] of error signal 405 with q[k] of quantization noise signal 604 to control the range of DCDL 602, this correlation may be used to set such DCDL range to be exactly one input cycle of an input clock signal, namely oscillation signal 418 in this example, for synchronization with ΔΣ modulator 603 for alignment of quantization noise signal 604 with associated noise in clock oscillation signal 418 for a complete quantization noise cancellation in feedback clock signal 419 output from DCDL 602.

Accordingly, inclusion of fractional-N divider 816 of FIG. 8 in fractional-N PLL 410 of FIG. 4 may provide a hybrid fractional-N PLL 810. Along those lines, a proportional path may be implemented in an analog domain to reduce latency and to provide high bandwidth, and an integral path may be implemented in a digital domain to reduce capacitance for loop filtering and to provide e[k] for quantization noise cancellation. Moreover, in fractional-N divider 816 of FIG. 8, feedback clock signal 419 output from DCDL 602 may be fed back as an input to ΔΣ modulators 801 and 802 for clocking.

Quantization noise cancellation may substantially reduce frequency variation of a DCO 417, such as a ring oscillator 417 for example. In other words, this cancellation may reduce the jitter at a DCO output, which in this example may be a recovered clock, namely oscillation signal 418, of a CDR block 200.

Moreover, a tradeoff between oscillator noise suppression and ΣΔ quantization noise filtering in a fractional-N PLL 810 may be decoupled from one another by background quantization noise cancellation as described herein. Therefore, a wide bandwidth hybrid fractional-N PLL may be provided with good jitter performance with a ring oscillator.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 9:
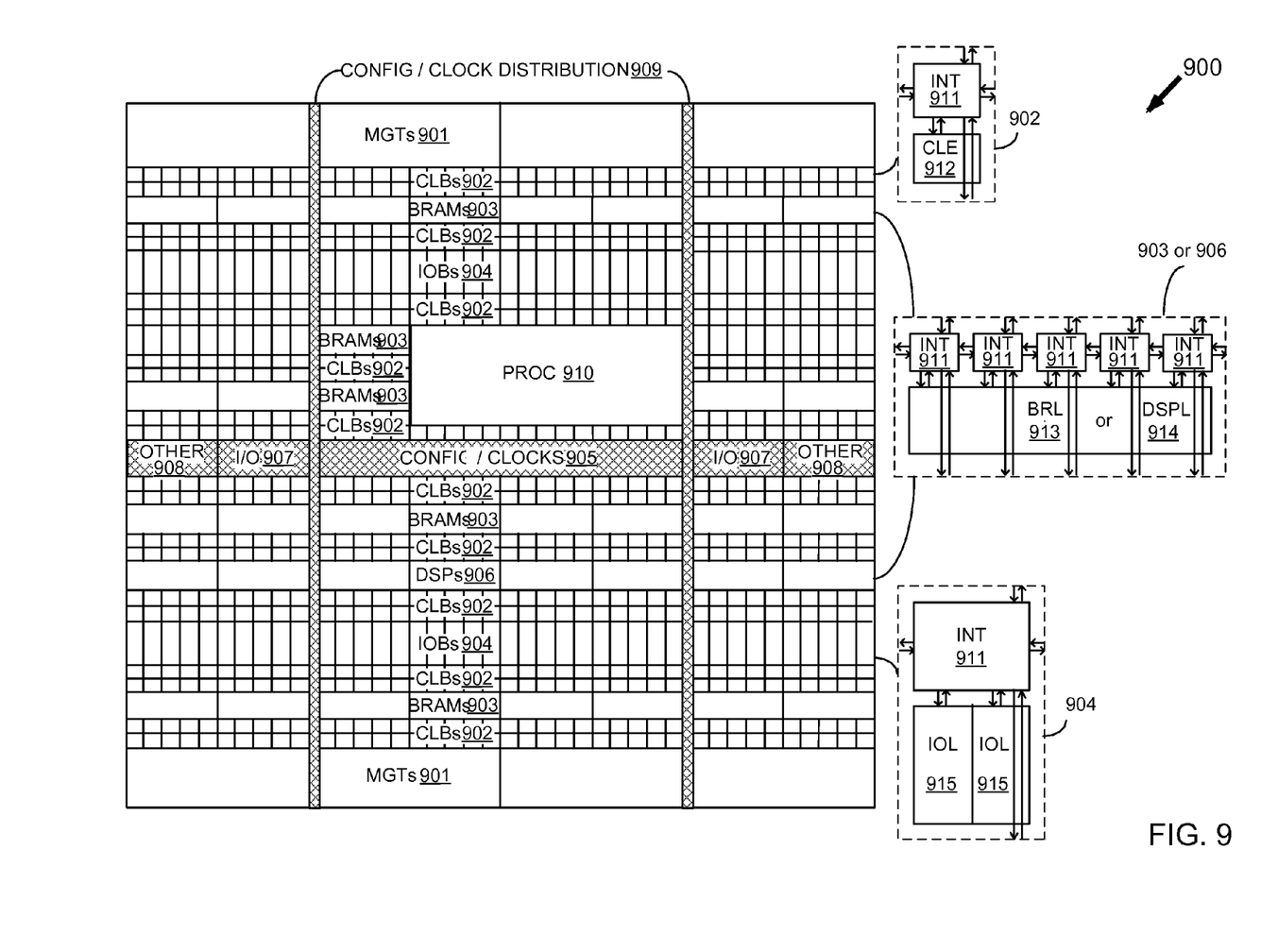
FIG. 9 is a simplified block diagram depicting an exemplary columnar Field Programmable Gate Array ("FPGA") architecture.

As noted above, advanced FPGAs can include several different types of programmable logic blocks in the array. For example, FIG. 9 illustrates an FPGA architecture 900 that includes a large number of different programmable tiles including multi-gigabit transceivers ("MGTs") 901, configurable logic blocks ("CLBs") 902, random access memory blocks ("BRAMs") 903, input/output blocks ("IOBs") 904, configuration and clocking logic ("CONFIG/CLOCKS") 905, digital signal processing blocks ("DSPs") 906, specialized input/output blocks ("I/O") 907 (e.g., configuration ports and clock ports), and other programmable logic 908 such as digital clock managers, analog-to-digital converters, system monitoring logic, and so forth. Some FPGAs also include dedicated processor blocks ("PROC") 910.

In some FPGAs, each programmable tile includes a programmable interconnect element ("INT") 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 can include a configurable logic element ("CLE") 912 that can be programmed to implement user logic plus a single programmable interconnect element ("INT") 911. A BRAM 903 can include a BRAM logic element ("BRL") 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element ("DSPL") 914 in addition to an appropriate number of programmable interconnect elements. An IOB 904 can include, for example, two instances of an input/output logic element ("IOL") 915 in addition to one instance of the programmable interconnect element 911. As will be clear to those of skill in the art, the actual I/O pads connected, for example, to the I/O logic element 915 typically are not confined to the area of the input/output logic element 915.

In the pictured embodiment, a horizontal area near the center of the die (shown in FIG. 9) is used for configuration, clock, and other control logic. Vertical columns 909 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 910 spans several columns of CLBs and BRAMs.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for clock and data recovery, comprising:
   a fractional-N phase-locked loop for receiving a reference signal, and for providing a proportional signal and an integral signal;
   a ring oscillator of the fractional-N phase-locked loop for receiving the proportional signal and the integral signal, and for providing an oscillation signal at a clock frequency substantially greater than a reference frequency of the reference signal;
   a data-to-frequency control word converter for receiving data input and the oscillation signal, and for providing a frequency control word;
   a fractional-N divider of the fractional-N phase-locked loop for receiving the frequency control word and the oscillation signal, and for providing a feedback clock signal to a phase-frequency detector of the fractional-N phase-locked loop; and
   the phase-frequency detector of the fractional-N phase-locked loop for receiving the reference signal and the feedback clock signal, and for adjusting a phase and frequency of the oscillation signal.

2. The apparatus according to claim 1, wherein the oscillation signal and the ring oscillator are local to a receiver lane for the clock and data recovery for the receiver lane.

3. The apparatus according to claim 1, wherein the reference signal is sourced from a single crystal oscillator.

4. The apparatus according to claim 1, wherein the proportional signal and the integral signal respectively are a proportional current signal and an integral current signal.

5. The apparatus according to claim 1, wherein the fractional-N divider comprises a modulator, a delay line, and a divider coupled for quantization noise cancellation.

6. The apparatus according to claim 1, wherein the data-to-frequency control word converter comprises:
   a phase detector for receiving the data input and the oscillation signal, and for providing a phase detection signal;
   a first buffer for receiving the phase detection signal, and for scaling the phase detection signal with a proportionality constant to provide a first scaled value;
   a second buffer for receiving the phase detection signal, and for scaling the phase detection signal with an integral constant to provide a second scaled value;
   an accumulator for accumulating the second scaled value to provide an accumulated value; and
   an adder for adding the accumulated value and the first scaled value to provide the frequency control word.

7. The apparatus according to claim 1, further comprising:
   a buffer for receiving a phase portion of the frequency control word, and for scaling the phase portion of the frequency control word with a proportionality constant to provide a scaled phase value; and
   the ring oscillator for receiving the scaled phase value to control a phase margin of the fractional-N phase-locked loop.

8. The apparatus according to claim 7, wherein the phase margin is controlled to be equal to or greater than 60 degrees.

9. The apparatus according to claim 1, wherein the fractional-N phase-locked loop comprises:
- a phase detector for receiving an up signal and a down signal from the phase-frequency detector, and for providing an error signal;
- an accumulator for accumulating the error signal to provide an accumulated value;
- a first digital-to-analog converter for receiving the accumulated value, and for providing the integral signal;
- a second digital-to-analog converter for receiving the up signal and the down signal from the phase-frequency detector, and for providing the proportional signal; and
- the fractional-N divider of the fractional-N phase-locked loop for receiving the error signal.

10. The apparatus according to claim 1, wherein no phase interpolator is included for the clock and data recovery.

11. A serial link system for supporting multiple frequencies via multiple lanes, comprising:
- a reference oscillator for providing a reference signal;
- a plurality of clock and data recovery blocks corresponding to the multiple lanes;
- the plurality of clock and data recovery blocks commonly coupled for receiving the reference signal;
- wherein each of the plurality of clock and data recovery blocks comprises:
  - a fractional-N phase-locked loop having a ring oscillator for providing an oscillation signal at a clock frequency substantially greater than a reference frequency of the reference signal;
  - a data-to-frequency control word converter for receiving a data input for a corresponding lane of the multiple lanes, for receiving the oscillation signal, and for providing a frequency control word as output; and
  - a fractional-N divider of the fractional-N phase-locked loop for receiving the frequency control word and the oscillation signal, and for providing a feedback clock signal to a phase-frequency detector of the fractional-N phase-locked loop.

12. The serial link system according to claim 11, wherein each of the plurality of clock and data recovery blocks comprises:
- the phase-frequency detector of the fractional-N phase locked loop for receiving the reference signal, and for providing a proportional signal and an integral signal;
- the ring oscillator of the fractional-N phase-locked loop for receiving the proportional signal and the integral signal, and for providing the oscillation signal; and
- the phase-frequency detector of the fractional-N phase-locked loop for receiving the reference signal and the feedback clock signal, and for adjusting a phase and frequency of the oscillation signal.

13. The serial link system according to claim 12, wherein the data-to-frequency control word converter of each of the plurality of clock and data recovery blocks comprises:
- a phase detector for receiving the data input and the oscillation signal, and for providing a phase detection signal;
- a first buffer for receiving the phase detection signal, and for scaling the phase detection signal with a proportionality constant to provide a first scaled value;
- a second buffer for receiving the phase detection signal, and for scaling the phase detection signal with an integral constant to provide a second scaled value;
- an accumulator for accumulating the second scaled value to provide an accumulated value; and
- an adder for adding the accumulated value and the first scaled value to provide the frequency control word.

14. The serial link system according to claim 12, wherein each of the plurality of clock and data recovery blocks comprises:
- a buffer for receiving a phase portion of the frequency control word, and for scaling the phase portion of the frequency control word with a proportionality constant to provide a scaled phase value; and
- the ring oscillator for receiving the scaled phase value, and for controlling a phase margin of the fractional-N phase-locked loop.

15. The serial link system according to claim 12, wherein the fractional-N phase-locked loop of each of the plurality of clock and data recovery blocks comprises:
- a phase detector for receiving an up signal and a down signal from the phase-frequency detector, and for providing an error signal;
- an accumulator for accumulating the error signal to provide an accumulated value;
- a first digital-to-analog converter for receiving the accumulated value, and for providing the integral signal;
- a second digital-to-analog converter for receiving the up signal and the down signal from the phase-frequency detector, and for providing the proportional signal; and
- the fractional-N divider of the fractional-N phase-locked loop, for receiving the error signal.

16. The serial link system according to claim 12, wherein the plurality of clock and data recovery blocks are respectively of a plurality of receivers, the serial link system further comprising:
- a plurality of transmitters corresponding to the plurality of receivers;
- wherein each of the plurality of transmitters comprises a transmitter phase-locked loop commonly coupled with the plurality of clock and data recovery blocks, for receiving the reference signal.

17. A method for clock and data recovery, comprising:
- receiving a reference signal by a fractional-N phase-locked loop;
- generating a proportional signal and an integral signal by the fractional-N phase-locked loop;
- receiving the proportional signal and the integral signal by a ring oscillator of the fractional-N phase-locked loop;
- outputting an oscillation signal by the ring oscillator at a clock frequency substantially greater than a reference frequency of the reference signal;
- receiving a data input and the oscillation signal by a data-to-frequency control word converter;
- providing a frequency control word by the data-to-frequency control word converter;
- receiving the frequency control word and the oscillation signal by a fractional-N divider of the fractional-N phase-locked loop;
- dividing the oscillation signal by the fractional-N divider to output a feedback clock signal;
- feeding back the feedback clock signal to a phase-frequency detector of the fractional-N phase-locked loop;
- receiving the reference signal and the feedback clock signal by the phase-frequency detector of the fractional-N phase-locked loop;
- providing an up signal and a down signal from the phase-frequency detector; and
- adjusting a phase and frequency of the oscillation signal responsive to the up signal and the down signal.

18. The method according to claim 17, further comprising cancelling quantization noise by the fractional-N divider.

19. The method according to claim 17, further comprising:
receiving a phase portion of the frequency control word by a buffer; and
scaling the phase portion of the frequency control word by the buffer with a proportionality constant to provide a scaled phase value.

20. The method according to claim 19, further comprising inputting the scaled phase value to the ring oscillator, to control a phase margin of the fractional-N phase-locked loop to be equal to or greater than 60 degrees.

* * * * *